(12) United States Patent
Shimizu

(10) Patent No.: US 12,272,625 B2
(45) Date of Patent: Apr. 8, 2025

(54) SEMICONDUCTOR DEVICE AND METHOD OF MANUFACTURING SEMICONDUCTOR DEVICE

(71) Applicant: Mitsubishi Electric Corporation, Tokyo (JP)

(72) Inventor: Yasutaka Shimizu, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 560 days.

(21) Appl. No.: 17/510,754

(22) Filed: Oct. 26, 2021

(65) Prior Publication Data

US 2022/0328383 A1 Oct. 13, 2022

(30) Foreign Application Priority Data

Apr. 8, 2021 (JP) ................................. 2021-066044

(51) Int. Cl.
| | | |
|---|---|---|
| *H01L 23/495* | (2006.01) | |
| *H01L 21/48* | (2006.01) | |
| *H01L 21/56* | (2006.01) | |
| *H01L 23/00* | (2006.01) | |

(52) U.S. Cl.
CPC .... *H01L 23/49555* (2013.01); *H01L 21/4803* (2013.01); *H01L 21/565* (2013.01); *H01L 24/32* (2013.01); *H01L 24/48* (2013.01); *H01L 2224/32225* (2013.01); *H01L 2224/48175* (2013.01)

(58) Field of Classification Search
CPC ................ H01L 23/48–49555; H01L 2924/15
See application file for complete search history.

(56) References Cited

U.S. PATENT DOCUMENTS

| | | |
|---|---|---|
| 5,763,946 A | 6/1998 | Nakadaira et al. |
| 2015/0061105 A1* | 3/2015 | Oose ........................ H01L 24/01 |
| | | 257/704 |
| 2019/0348349 A1* | 11/2019 | Sugiyama ............. H01L 23/057 |
| 2022/0262895 A1* | 8/2022 | Nakagome .............. H01L 28/92 |

FOREIGN PATENT DOCUMENTS

| | | | |
|---|---|---|---|
| JP | H11-345669 A | | 12/1999 |
| JP | 2009277959 A | * | 11/2009 |

OTHER PUBLICATIONS

JP2009277959 Translation (Year: 2009).*
An Office Action issued by the German Patent and Trademark Office on Dec. 11, 2024, which corresponds to German U.S. Appl. No. 17/510,754.3 and is related to U.S. Appl. No. 17/510,754; with English language translation.

* cited by examiner

*Primary Examiner* — Eric K Ashbahian
*Assistant Examiner* — Halee Cramer
(74) *Attorney, Agent, or Firm* — Studebaker Brackett PLLC

(57) ABSTRACT

According to an aspect of the present disclosure, a semiconductor device includes a substrate, a resin case surrounding a region just above the substrate in a planar view, a semiconductor chip provided in the region and an electrode including a first portion pulled out from an upper surface of the resin case and a second portion provided below the upper surface of the resin case and to be inserted into the resin case, and being electrically connected to the semiconductor chip, wherein a first notch is formed over the first portion to the second portion in the electrode, and a first groove is formed to expose a portion, formed in the second portion, in the first notch on the upper surface of the resin case.

8 Claims, 13 Drawing Sheets

SEMICONDUCTOR DEVICE AND METHOD OF MANUFACTURING SEMICONDUCTOR DEVICE

BACKGROUND OF THE INVENTION

Field

The present disclosure relates to a semiconductor device and a method of manufacturing the semiconductor device.

Background

JP2009-277959A discloses a semiconductor device capable of preventing a resin flash from adhering to an external electrode. In the semiconductor device, an IGBT and the external electrode are electrically connected to each other. A housing seals the IGBT such that a part of the external electrode is guided out therefrom. The external electrode has a through hole provided at the root of its portion guided out from the housing. At least a part of the through hole is filled with thermoplastic resin composing the housing.

In a semiconductor device as in JP2009-277959A, if the external electrode has a notch, resin enters the notch when a resin case is molded so that a resin flash may occur.

SUMMARY

The present disclosure has been made to solve the above-described problem, and is directed to obtaining a semiconductor device capable of preventing a resin flash and a method of manufacturing the semiconductor device.

The features and advantages of the present disclosure may be summarized as follows.

According to an aspect of the present disclosure, a semiconductor device includes a substrate, a resin case surrounding a region just above the substrate in a planar view, a semiconductor chip provided in the region and an electrode including a first portion pulled out from an upper surface of the resin case and a second portion provided below the upper surface of the resin case and to be inserted into the resin case, and being electrically connected to the semiconductor chip, wherein a first notch is formed over the first portion to the second portion in the electrode, and a first groove is formed to expose a portion, formed in the second portion, in the first notch on the upper surface of the resin case.

According to an aspect of the present disclosure, a method of manufacturing a semiconductor device includes inserting an electrode having a notch formed therein into a metal mold such that a part of the electrode is arranged in a space in the metal mold and the notch is not arranged in the space, forming a resin case into which the electrode is inserted by pouring resin into the space with the electrode inserted into the metal mold, arranging the resin case to surround a region just above a substrate in a planar view and arranging a semiconductor chip in the region.

Other and further objects, features and advantages of the disclosure will appear more fully from the following description.

DESCRIPTION OF EMBODIMENTS

Figure 1:
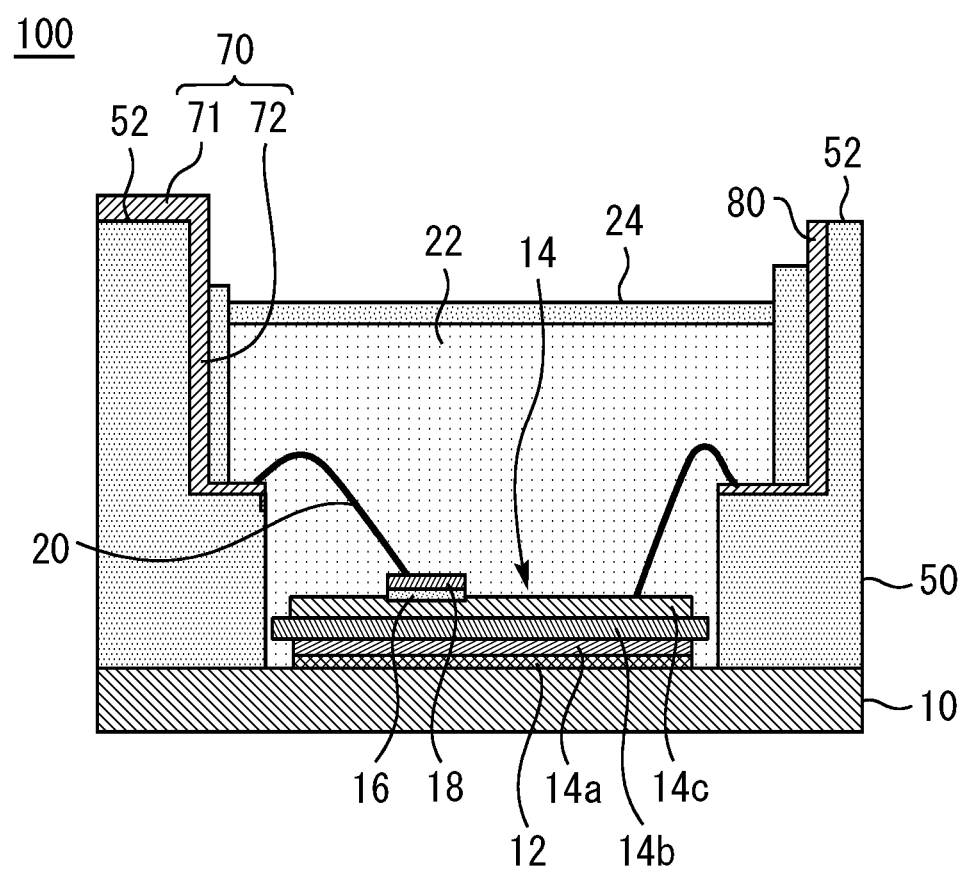
FIG. 1 is a cross-sectional view of a semiconductor device according to a first embodiment.

Semiconductor devices and methods of manufacturing the semiconductor devices according to embodiments of the present disclosure will be described with reference to the accompanying drawings. Components identical or corresponding to each other are indicated by the same reference characters, and repeated description of them is avoided in some cases.

First Embodiment

FIG. 1 is a cross-sectional view of a semiconductor device 100 according to a first embodiment. The semiconductor device 100 includes a base plate 10 and an insulating substrate 14 boded to an upper surface of the base plate 10 with a bonding material 12. The insulating substrate 14 includes a conductive layer 14a, an insulating layer 14b provided on the conductive layer 14a, and a circuit pattern 14c provided on the insulating layer 14b. A semiconductor chip 18 is bonded to the circuit pattern 14c with a bonding material 16.

The semiconductor device 100 includes a resin case 50 surrounding a region just above the base plate 10 or the insulating substrate 14 in a planar view. The semiconductor chip 18 is provided in the region just above the base plate 10 or the insulating substrate 14. The region just above the base plate 10 or the insulating substrate 14 is sealed with a sealing material 22. A lid 24 is provided on the sealing material 22.

Electrodes 70 and 80 are inserted into the resin case 50. The resin case 50 is also referred to as an insert case. The electrodes 70 and 80 are electrically connected to the semiconductor chip 18 via a wire 20 or the circuit pattern 14c.

The electrode 70 includes a first portion 71 and a second portion 72. The first portion 71 is a portion pulled out from an upper surface 52 of the resin case 50. The second portion 72 is a portion provided below the upper surface 52 of the resin case 50 and to be inserted into the resin case 50. The second portion 72 extends downward. In the present embodiment, a lower end of the second portion 72 is connected to the semiconductor chip 18 via the wire 20.

Figure 2:
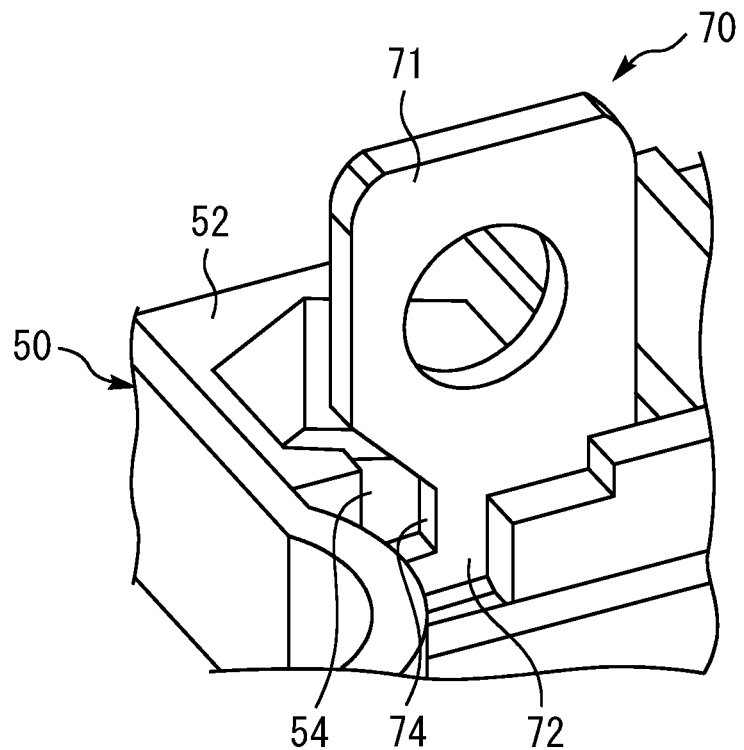
FIG. 2 is a perspective view illustrating respective structures of the electrode and the resin case according to the first embodiment.
Figure 3:
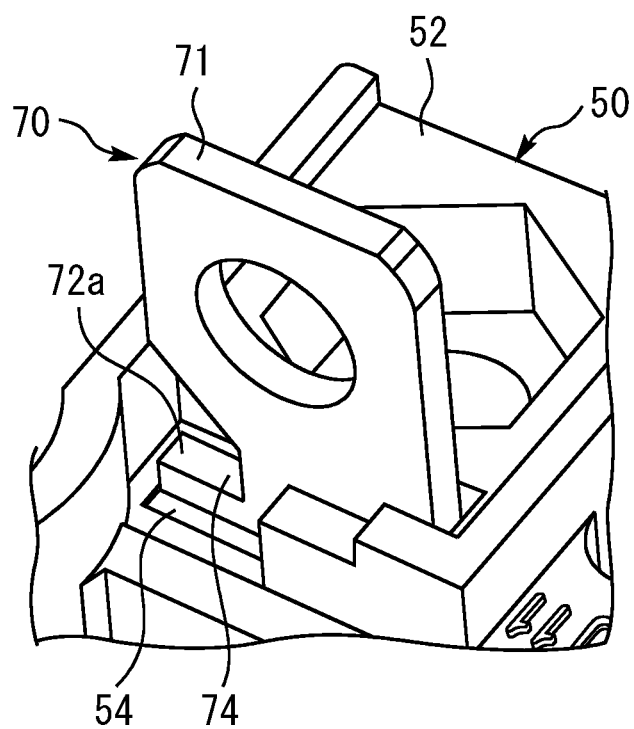
FIG. 3 is a perspective view illustrating the electrode and the resin case according to the first embodiment as viewed from another angle.
Figure 4:
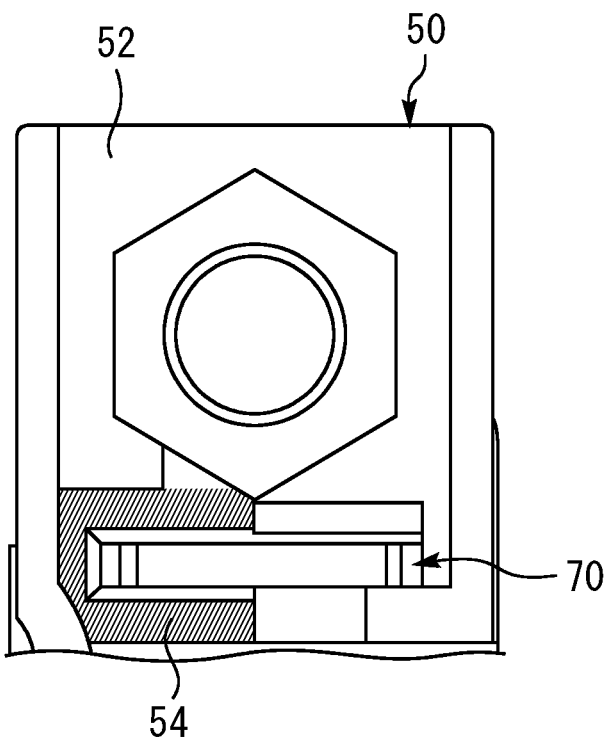
FIG. 4 is a plan view illustrating the respective structures of the electrode and the resin case according to the first embodiment.

FIG. 2 is a perspective view illustrating respective structures of the electrode 70 and the resin case 50 according to the first embodiment. FIG. 3 is a perspective view illustrating the electrode 70 and the resin case 50 according to the first embodiment as viewed from another angle. FIG. 4 is a plan view illustrating the respective structures of the electrode 70 and the resin case 50 according to the first embodiment. The electrode 70 has a flat plate shape, for example. A notch 74 is formed over the first portion 71 to the second portion 72 in the electrode 70. The notch 74 notches one side of the electrode 70.

A groove 54 is formed on the upper surface 52 of the resin case 50 to expose a portion, formed in the second portion 72, in the notch 74. As illustrated as a hatched portion in FIG. 4, the groove 54 is formed to cover a portion, where the notch 74 is formed, in the electrode 70 in a planar view. A bottom portion of the groove 54 is provided below the notch 74. The groove 54 exposes an upper surface 72a of the second portion 72 forming the notch 74. That is, the groove 54 exposes the entire notch 74 from the resin case 50.

Figure 5:
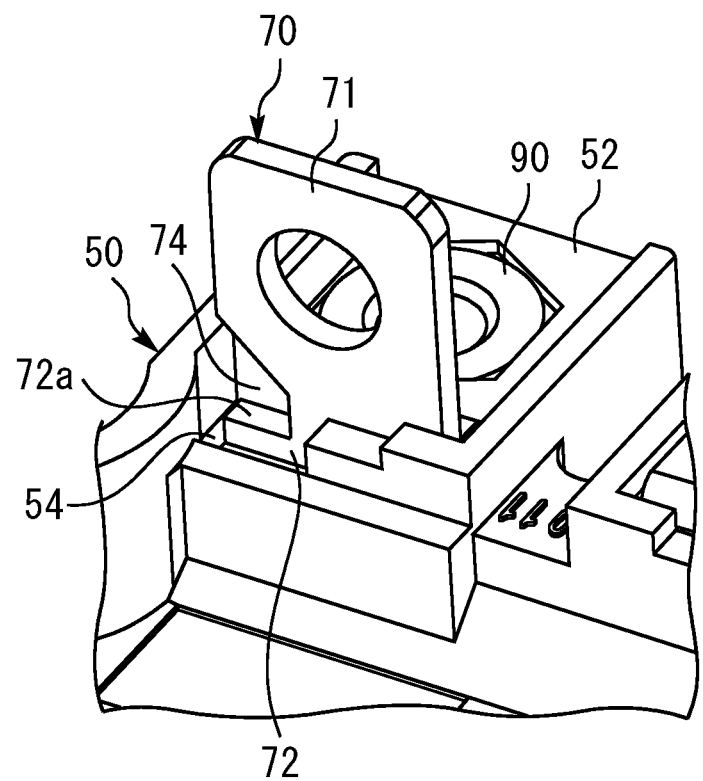
FIG. 5 is a diagram illustrating a state where a nut is attached to the resin case according to the first embodiment.

FIG. 5 is a diagram illustrating a state where a nut 90 is attached to the resin case 50 according to the first embodiment. A recess for accommodating the nut 90 is formed on the upper surface 52 of the resin case 50.

Figure 6:
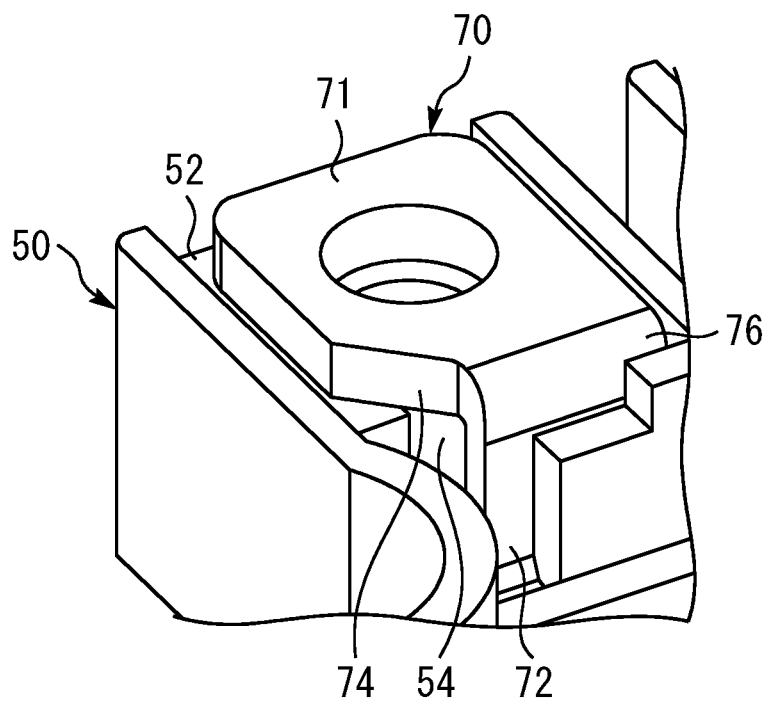
FIG. 6 is a perspective view illustrating a state where the electrode is folded according to the first embodiment.
Figure 7:
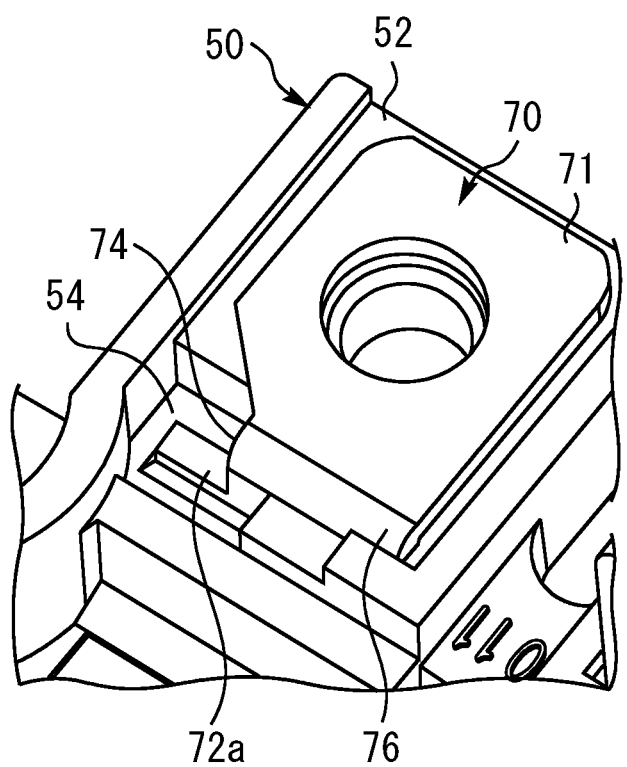
FIG. 7 is a perspective view illustrating the state where the electrode is folded according to the first embodiment as viewed from another angle.
Figure 8:
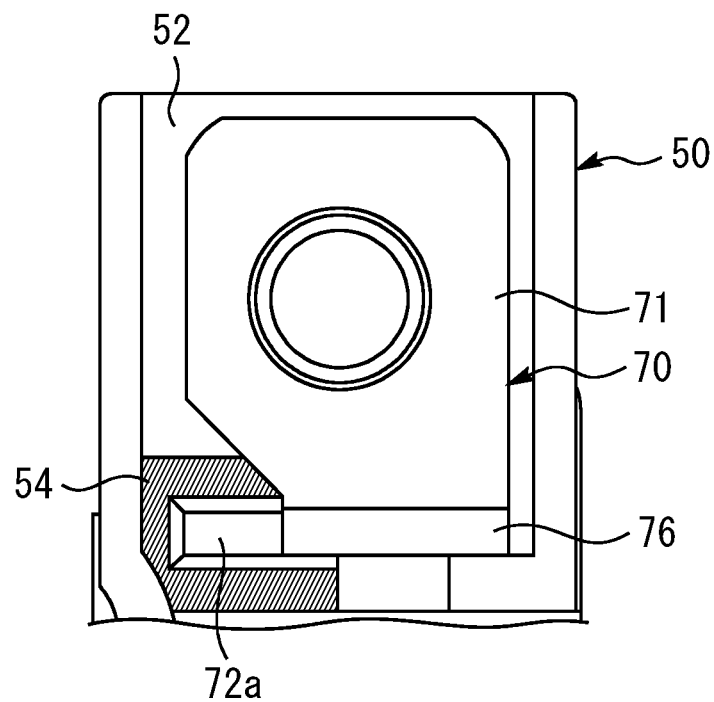
FIG. 8 is a plan view illustrating a state where the electrode is folded according to the first embodiment.

FIG. 6 is a perspective view illustrating a state where the electrode 70 is folded according to the first embodiment. FIG. 7 is a perspective view illustrating the state where the electrode 70 is folded according to the first embodiment as viewed from another angle. FIG. 8 is a plan view illustrating the state where the electrode 70 is folded according to the first embodiment. The first portion 71 extends along the upper surface 52 of the resin case 50 with the electrode 70 folded. At this time, a hole of the nut 90 and a through hole formed in the first portion 71 overlap each other. The electrode 70 includes a bending portion 76 that connects the first portion 71 and the second portion 72 to each other.

Figure 9:
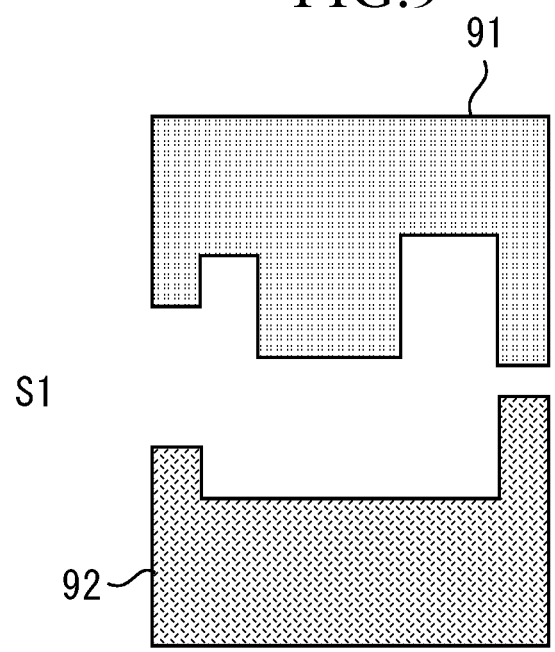
FIGS. 9 to 13 are diagrams each illustrating the method of manufacturing the semiconductor device according to the first embodiment.

Then, a method of manufacturing the semiconductor device 100 will be described. FIGS. 9 to 13 are diagrams each illustrating the method of manufacturing the semiconductor device 100 according to the first embodiment. First, as illustrated in FIG. 9, a metal mold is prepared (step 1). The metal mold includes an upper metal mold 91 and a lower metal mold 92. The metal mold is a mold for resin molding, and is formed of a metal, for example. The metal mold may be formed of a material other than a metal.

Figure 10:
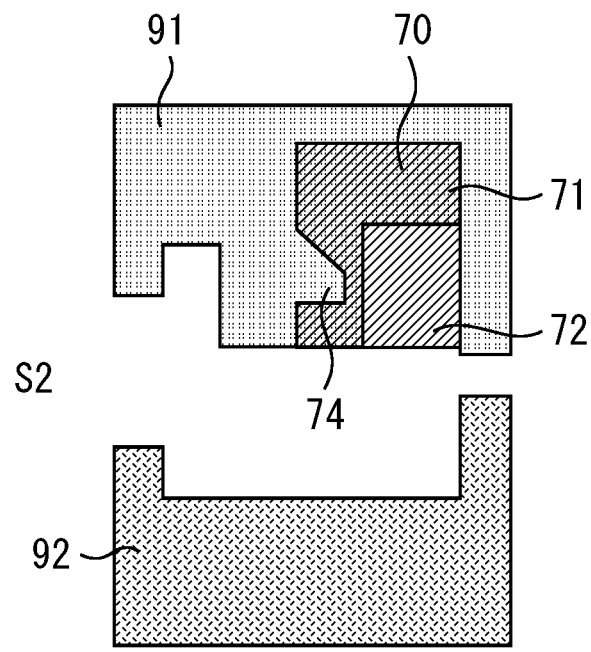
Figure 11:
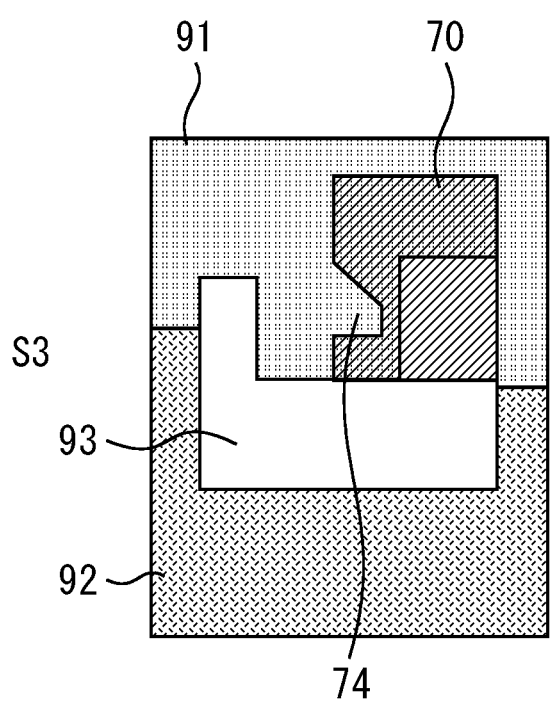
Figure 12:
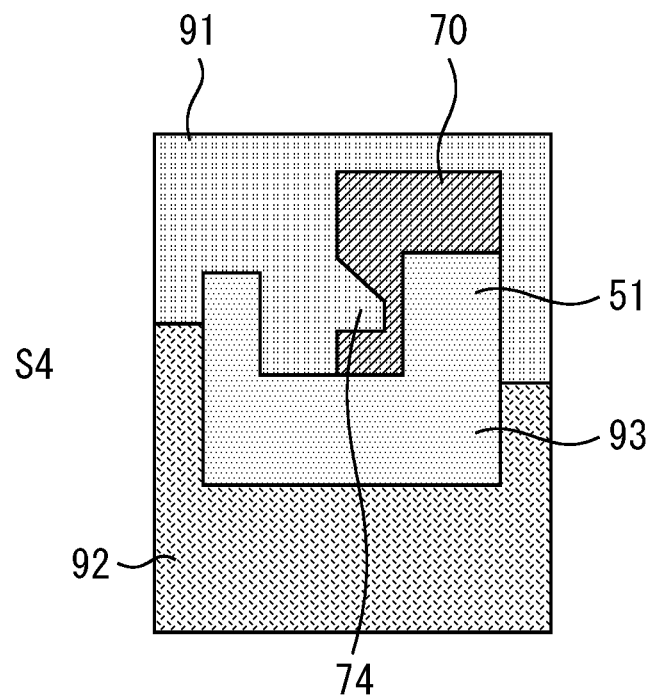
Figure 13:
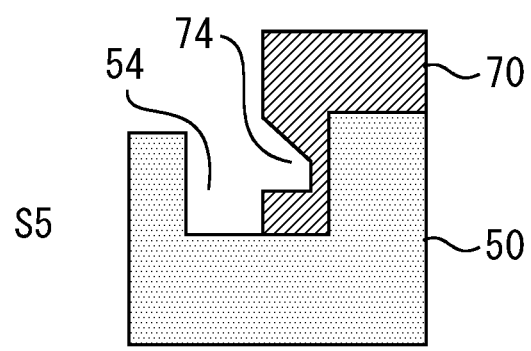

Then, as illustrated in FIG. 10, an electrode 70 is inserted into the metal mold (step 2). Then, as illustrated in FIG. 11, the metal mold is closed (step 3). As a result, a space 93 covered with the upper metal mold 91 and the lower metal mold 92 is formed. A part of the electrode 70 is arranged in the space 93 in the metal mold, and the notch 74 is not arranged in the space 93. The notch 74 is provided above the space 93. Then, as illustrated in FIG. 12, resin 51 is poured into the space 93 with the electrode 70 inserted into the metal mold (step 4). As a result, as illustrated in FIG. 13, the resin case 50 into which the electrode 70 is inserted is formed (step 5). Although the electrode 70 has been described as an example, the electrode 80 may be inserted into the metal mold in step 2.

Then, the resin case 50 is arranged to surround a region just above the insulating substrate 14 in a planar view. The semiconductor chip 18 is arranged in the region just above the insulating substrate 14. Then, the connection via the wire 20 is performed and the inside of the resin case 50 is sealed with the sealing material 22. The lid 24 is provided on the sealing material 22.

Figure 14:
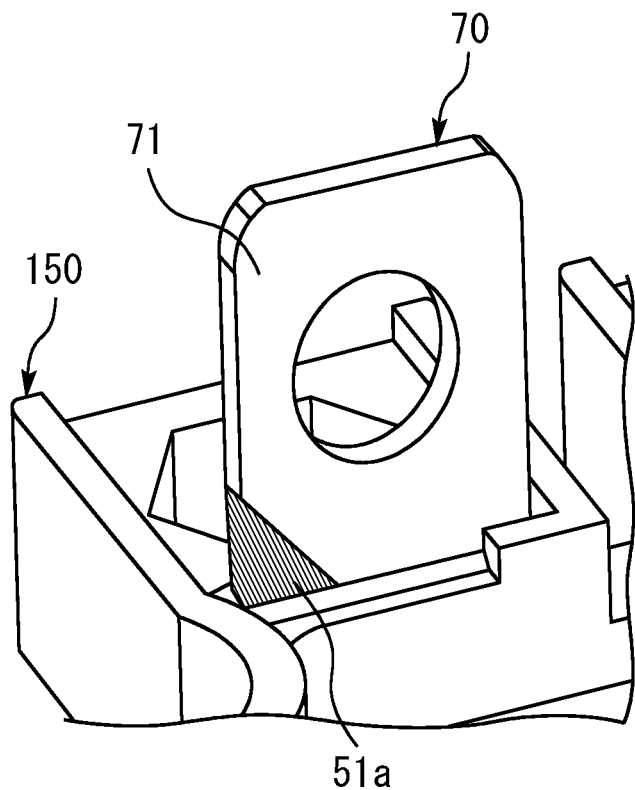
FIG. 14 is a perspective view illustrating respective structures of an electrode and a resin case according to a comparative example.
Figure 15:
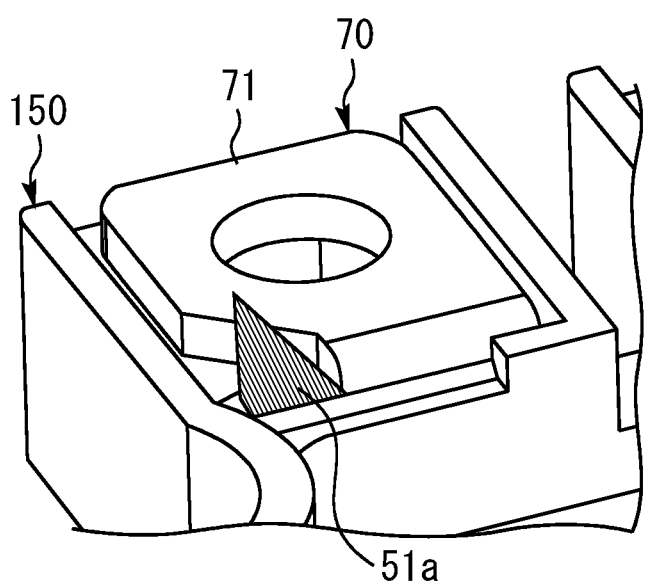
FIG. 15 is a perspective view illustrating a state where the electrode is folded according to the comparative example.
Figure 16:
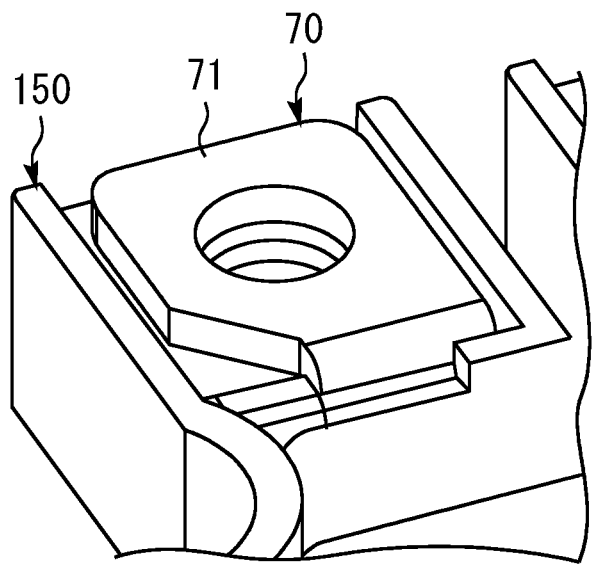
FIG. 16 is a perspective view illustrating a state where the resin flash is removed in a semiconductor device according to the comparative example.

FIG. 14 is a perspective view illustrating respective structures of an electrode 70 and a resin case 150 according to a comparative example. FIG. 15 is a perspective view illustrating a state where the electrode 70 is folded according to the comparative example. A groove 54 is not formed in the resin case 150 according to the comparative example. In such a configuration, resin 51a may enter a notch 74 in the electrode 70 when the resin case 150 is molded. The resin 51a also remains after the electrode 70 is bent, to be a resin flash. Accordingly, the resin flash needs to be removed. FIG. 16 is a perspective view illustrating a state where the resin flash is removed in a semiconductor device according to the comparative example.

On the other hand, the groove 54 is formed on the upper surface 52 of the resin case 50 to expose the portion, formed in the second portion 72, in the notch 74 in the electrode 70. This configuration makes it possible to arrange the metal mold around the notch 74 when the resin case 50 is molded and to prevent resin from entering the notch 74. Therefore, a resin flash can be suppressed. In the method of manufacturing the semiconductor device 100 according to the present embodiment, the notch 74 in the electrode 70 is not arranged in the space 93, into which the resin 51 is poured, in the metal mold. Accordingly, the resin 51 can be prevented from entering the notch 74. Therefore, the resin flash can be suppressed. As a result, the step for removing the resin flash can be omitted, and the manufacturing cost of the resin case 50 can be reduced.

In the present embodiment, the notch 74 in the electrode 70 is exposed from the resin case 50. Accordingly, it can be confirmed whether or not the electrode 70 is arranged at a correct position. The resin case 50 can be manufactured using a general method of manufacturing the insert case. Accordingly, a new equipment investment for manufacturing the resin case 50 can be suppressed.

Figure 17:
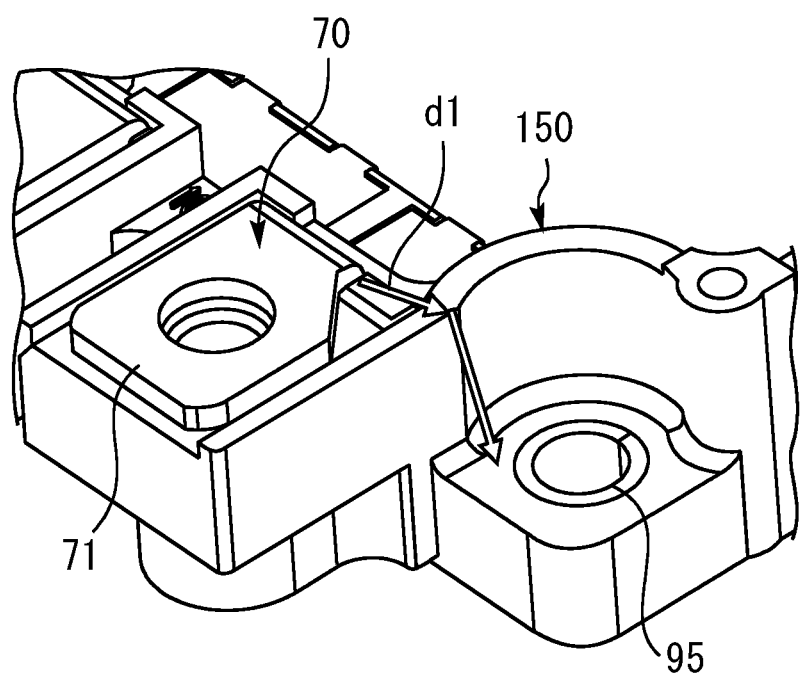
FIG. 17 is a perspective view illustrating a creepage distance between the electrode and a conductive component according to the comparative example.
Figure 18:
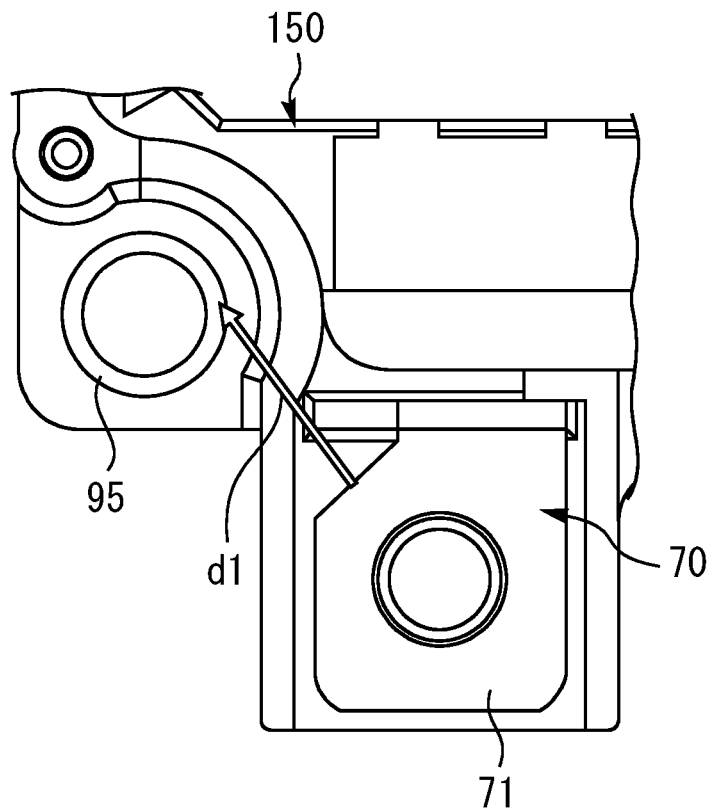
FIG. 18 is a plan view illustrating the creepage distance between the electrode and the conductive component according to the comparative example.

FIG. 17 is a perspective view illustrating a creepage distance d1 between the electrode 70 and a conductive component 95 according to the comparative example. FIG. 18 is a plan view illustrating the creepage distance d1 between the electrode 70 and the conductive component 95 according to the comparative example. The conductive component 95 is a product attachment screw for attaching a semiconductor device 100 to a product, for example. The notch 74 in the electrode 70 is formed to ensure an appropriate creepage distance d1 from an adjacent conductive component 95. That is, the notch 74 in the electrode 70 is formed to extend the creepage distance d1 between the adjacent conductive component 95 and the electrode 70.

Figure 19:
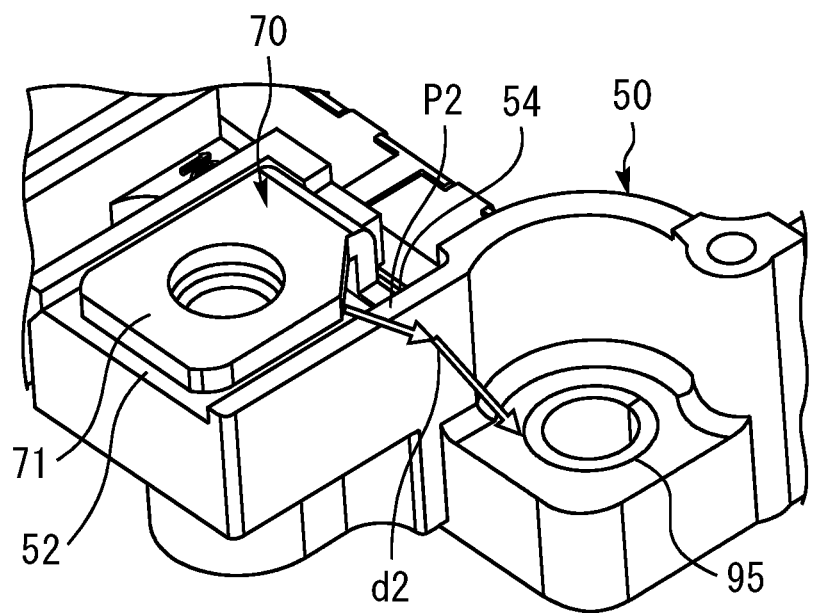
FIG. 19 is a perspective view illustrating a creepage distance between the electrode and a conductive component according to the first embodiment.
Figure 20:
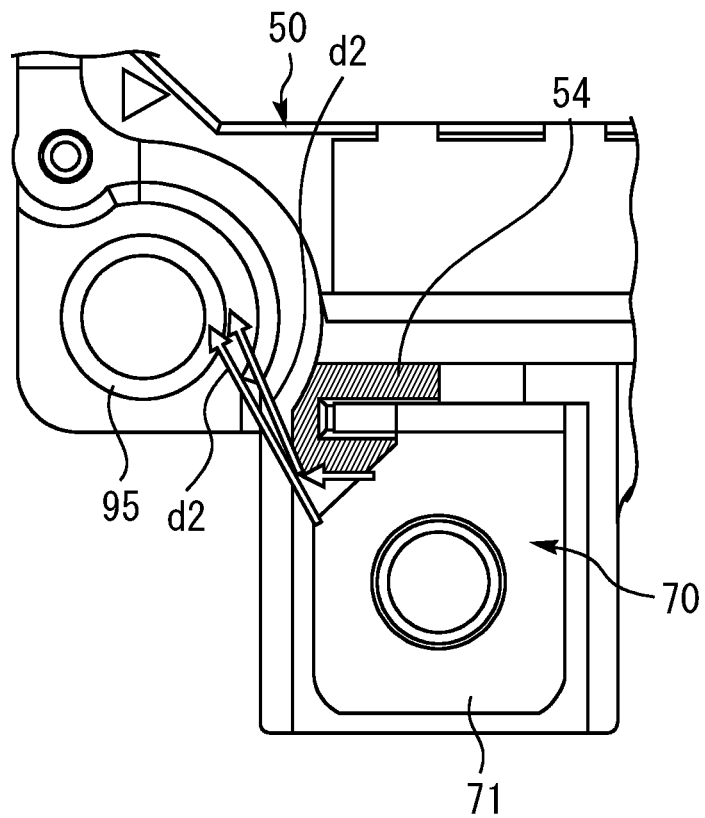
FIG. 20 is a plan view illustrating the creepage distance between the electrode and the conductive component according to the first embodiment.

FIG. 19 is a perspective view illustrating a creepage distance d2 between the electrode 70 and a conductive component 95 according to the first embodiment. FIG. 20 is a plan view illustrating the creepage distance d2 between the electrode 70 and the conductive component 95 according to the first embodiment. In the present embodiment, the groove 54 is formed in the resin case 50. Accordingly, the creepage distance d2 between the electrode 70 and the conductive component 95 can be made longer than the creepage distance d1 in the comparative example.

Figure 21:
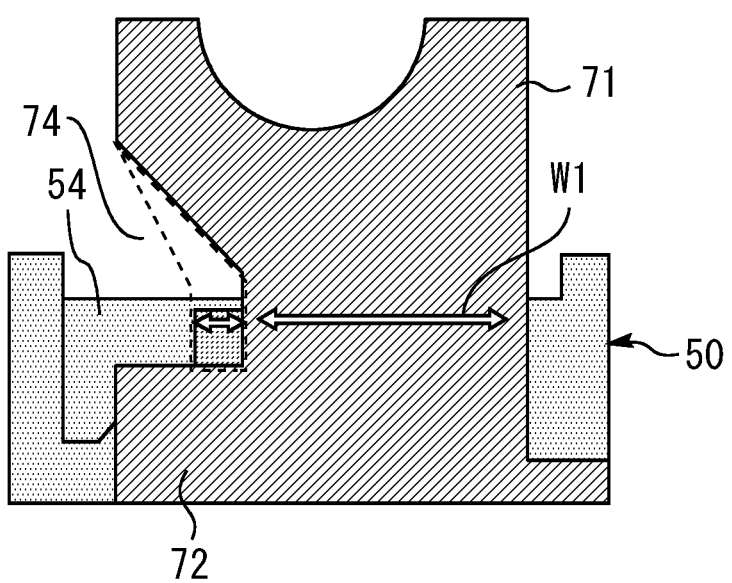
FIG. 21 is a diagram illustrating a width of the electrode according to the first embodiment.

FIG. 21 is a diagram illustrating a width W1 of the electrode 70 according to the first embodiment. In the present embodiment, the creepage distance d2 between the electrode 70 and the conductive component 95 can be kept large, as described above. Thus, the width W1 of the electrode 70 can be increased. Accordingly, the electrode 70 can easily dissipate heat, and generation of heat by the electrode 70 at the time of product use can be reduced.

The semiconductor device 100 according to the present embodiment can be used in all situations such as power generation, power transmission, and efficient use or reproduction of energy. The semiconductor chip 18 may be an IGBT (insulated gate bipolar transistor) or a diode, for example. The number of semiconductor chips 18 included in the semiconductor device 100 is not limited. A structure of the semiconductor device 100 is not limited to that illustrated in FIG. 1. For example, the semiconductor chip 18 and the electrodes 70 and 80 may be directly connected to each other without via the wire 20.

The semiconductor chip 18 is made with silicon or a wide bandgap semiconductor, for example. An example of the wide bandgap semiconductor is silicon carbide, a gallium nitride-based material, or diamond. When the semiconductor chip 18 is made with a wide bandgap semiconductor, a large current density is assumed. In the present embodiment, the width of the electrode 70 is increased, whereby generation of heat can be reduced even when the current density of the semiconductor chip 18 is large.

These modifications can be appropriately applied to semiconductor devices and methods of manufacturing the semiconductor devices according to embodiments below. Meanwhile, for the semiconductor devices and the methods of manufacturing the semiconductor devices according to the embodiments below, dissimilarities with the first embodiment will mainly be explained as they have many similarities with the first embodiment.

Second Embodiment

Figure 22:
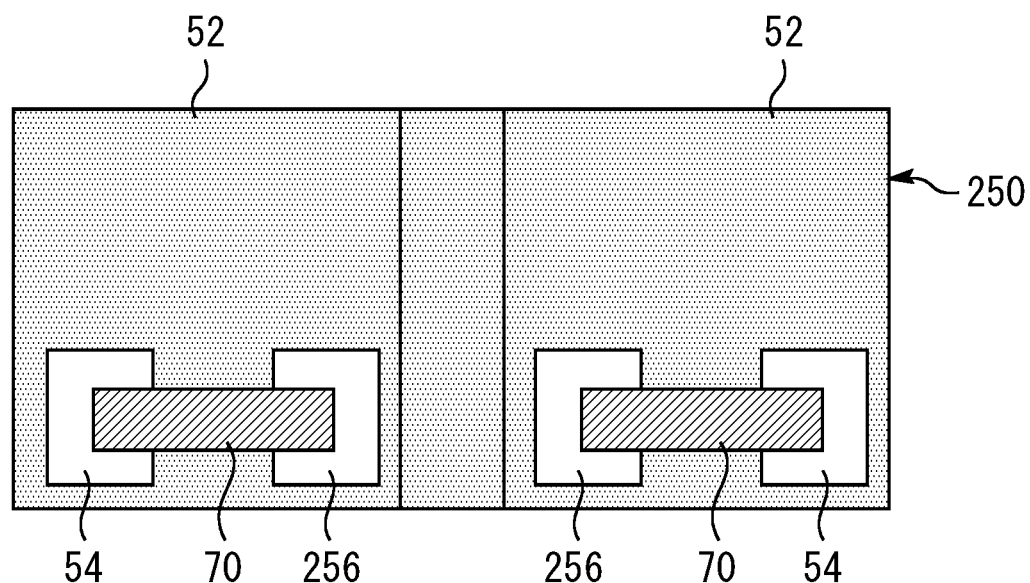
FIG. 22 is a plan view illustrating respective structures of an electrode and a resin case according to a second embodiment.
Figure 23:
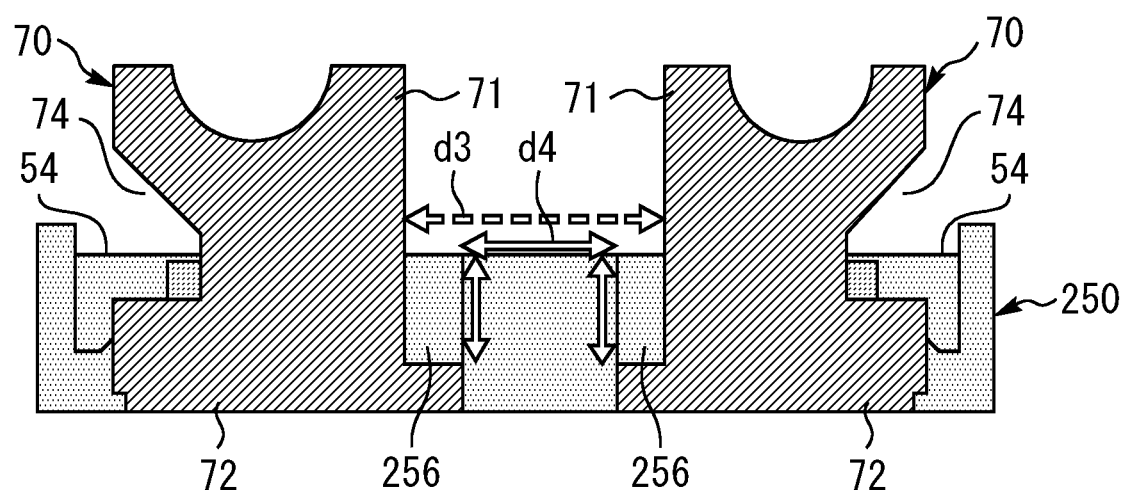
FIG. 23 is a cross-sectional view illustrating the respective structures of the electrode and the resin case according to the second embodiment.

FIG. 22 is a plan view illustrating respective structures of an electrode 70 and a resin case 250 according to a second embodiment. FIG. 23 is a cross-sectional view illustrating the respective structures of the electrode 70 and the resin case 250 according to the second embodiment. In the present embodiment, a structure of a groove formed on an upper surface 52 of the resin case 250 differs from that in the first embodiment. Other structures are similar to those in the first embodiment.

A groove 256 is further formed in addition to a groove 54 on the upper surface 52 of the resin case 250. The groove 256 exposes a portion, on the opposite side to a portion where a notch 74 is formed in a width direction of the electrode 70, in the electrode 70. The groove 256 exposes a portion, on the side of adjacent another electrode 70, in the electrode 70. That is, the grooves 54 and 256 are respectively formed to cover both sides of the electrode 70 on the upper surface 52 of the resin case 250.

As illustrated in FIG. 23, a creepage distance d4 between the adjacent electrodes 70 in a case where the grooves 256 exist is larger than a creepage distance d3 between the adjacent electrodes 70 in a case where the grooves 256 do not exist. Accordingly, the width W1 of the electrode 70 can further be increased, and generation of heat by the electrode 70 at the time of product use can be reduced.

Third Embodiment

Figure 24:
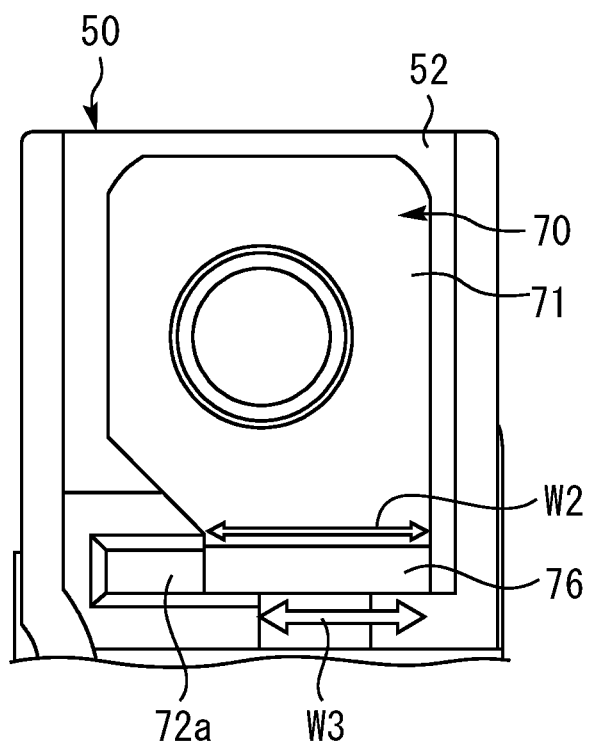
FIG. 24 is a plan view illustrating respective structures of an electrode and a resin case according to a third embodiment.

FIG. 24 is a plan view illustrating respective structures of an electrode 70 and a resin case 50 according to a third embodiment. In the present embodiment, in a width direction of the electrode 70, a length W3 of a portion, covered with the resin case 50, in a bending portion 76 is one-half or more a width W2 of the bending portion 76. As a result, when the resin case 50 is manufactured, bending processing of the electrode 70 can be made easy. A stress to be applied to the resin case 50 can be suppressed when the electrode 70 is bent.

Fourth Embodiment

Figure 25:
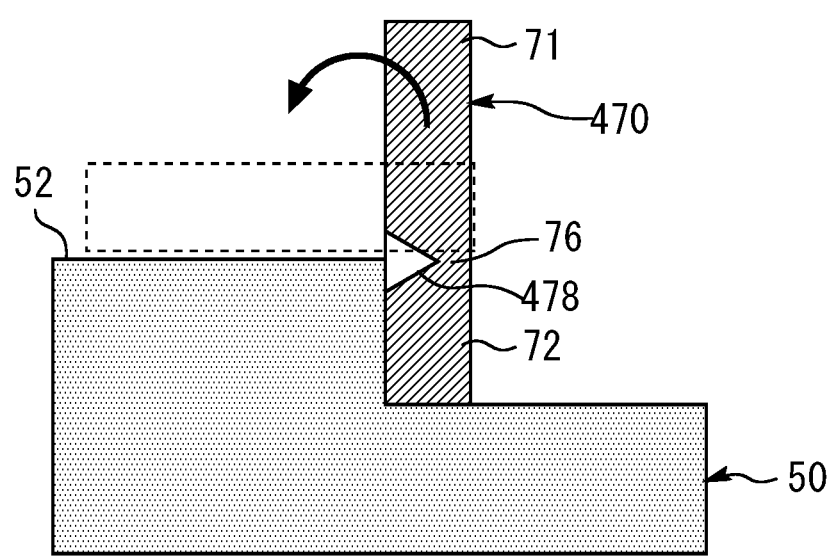
FIG. 25 is a cross-sectional view illustrating respective structures of an electrode and a resin case according to a fourth embodiment.

FIG. 25 is a cross-sectional view illustrating respective structures of an electrode 470 and a resin case 50 according to a fourth embodiment. In the present embodiment, the structure of the electrode 470 differs from that in the first embodiment. Other structures are similar to those in the first embodiment. A notch 478 is further formed inside a bending portion 76 in the electrode in addition to a notch 74. The notch 478 is also referred to as coining. When the notch 478 is previously formed in the electrode 470, bending processing of the electrode 470 can be easily performed. When the electrode 470 is bent, a stress to be applied to the resin case 50 can be suppressed.

Meanwhile, technical features explained in each embodiment may be appropriately combined to use.

In the semiconductor device according to the present disclosure, the first groove is formed on the upper surface of the resin case to expose the portion, formed in the second portion, in the first notch in the electrode. This configuration makes it possible to arrange a metal mold around the first notch when the resin case is molded and to prevent resin from entering the first notch. Therefore, a resin flash can be suppressed.

In the method of manufacturing the semiconductor device according to the present disclosure, the notch in the electrode is not arranged in the space, into which the resin is poured, in the metal mold. Accordingly, the resin can be prevented from entering the notch. Therefore, a resin flash can be suppressed.

Obviously many modifications and variations of the present disclosure are possible in the light of the above teachings. It is therefore to be understood that within the scope of the appended claims the disclosure may be practiced otherwise than as specifically described.

The entire disclosure of a Japanese Patent Application No. 2021-066044, filed on Apr. 8, 2021 including specification, claims, drawings and summary, on which the Convention priority of the present application is based, are incorporated herein by reference in its entirety.

The invention claimed is:

1. A semiconductor device comprising:
   a substrate:
   a resin case surrounding a region just above the substrate in a planar view;
   a semiconductor chip provided in the region; and
   an electrode including a first portion pulled out from an upper surface of the resin case and a second portion provided below the upper surface of the resin case and to be inserted into the resin case, and being electrically connected to the semiconductor chip, wherein
   a first notch is formed over the first portion to the second portion in the electrode, and
   a first groove is formed to expose a portion, formed in the second portion, in the first notch on the upper surface of the resin case, wherein
   the first groove exposes an upper surface of the second portion forming the first notch.

2. The semiconductor device according to claim 1, wherein
   the first portion extends along the upper surface of the resin case, and
   the first notch is formed to extend a creepage distance between an adjacent conductive component and the electrode.

3. The semiconductor device according to claim 1, wherein at the upper surface of the resin case includes a second groove that exposes a third portion of the electrode on the opposite side to where the first notch is formed in a width direction of the electrode.

4. The semiconductor device according to claim 1, wherein at the upper surface of the resin case includes a second groove that exposes a portion of the electrode on the side of another adjacent electrode.

5. The semiconductor device according to claim 1, wherein
   the first portion extends along the upper surface of the resin case,
   the second portion is inserted into the resin case to extend downward,
   the electrode includes a bending portion that connects the first portion and the second portion to each other, and
   a length of a portion in the bending portion covered with the resin case is one-half or more a length of the bending portion in the width direction of the electrode.

6. The semiconductor device according to claim 1, wherein
   the first portion extends along the upper surface of the resin case,
   the second portion is inserted into the resin case to extend downward,
   the electrode includes a bending portion that connects the first portion and the second portion to each other, and
   a second notch is formed inside the bending portion in the electrode.

7. The semiconductor device according to claim 1, wherein the semiconductor chip is made with a wide band gap semiconductor.

8. The semiconductor device according to claim 7, wherein the wide band gap semiconductor is silicon carbide, gallium-nitride-based material or diamond.

* * * * *